(12) United States Patent
Yang (10) Patent No.: US 8,251,411 B2
(45) Date of Patent: Aug. 28, 2012

(54) LATCHING MECHANISM AND ELECTRONIC DEVICE USING THE SAME

(75) Inventor: Kuo-Lung Yang, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 172 days.

(21) Appl. No.: 12/813,696

(22) Filed: Jun. 11, 2010

(65) Prior Publication Data
US 2011/0215686 A1    Sep. 8, 2011

(30) Foreign Application Priority Data
Mar. 2, 2010   (TW) ............................... 99106051 A (51) Int. Cl.
   E05C 17/56   (2006.01)
   E05C 19/16   (2006.01)
(52) U.S. Cl. ................................................. 292/251.5
(58) Field of Classification Search ............... 292/251.5, 292/DIG. 71
   See application file for complete search history.

(56) References Cited

U.S. PATENT DOCUMENTS

| | | | | |
|---|---|---|---|---|
| 2,471,635 A * | 5/1949 | Mark et al. | .................... | 49/478.1 |
| 2,524,924 A * | 10/1950 | Pampallona | ................ | 292/251.5 |
| 2,801,870 A * | 8/1957 | Davey | .......................... | 292/251.5 |
| 2,871,676 A * | 2/1959 | Miller et al. | ..................... | 62/264 |
| 2,877,041 A * | 3/1959 | Foley | .......................... | 292/251.5 |
| 2,904,364 A * | 9/1959 | Korodi | ......................... | 292/251.5 |
| 3,468,576 A * | 9/1969 | Beyer et al. | ................. | 292/251.5 |
| 6,260,892 B1 * | 7/2001 | Chang | .......................... | 292/251.5 |
| 6,552,314 B2 * | 4/2003 | Fukushima et al. | .......... | 219/723 |
| 7,082,035 B2 * | 7/2006 | Kim | .............................. | 361/726 |
| 7,543,862 B2 * | 6/2009 | Lin | ................................ | 292/251.5 |
| 7,661,732 B2 * | 2/2010 | Hsu et al. | .................... | 292/251.5 |
| 7,825,757 B2 * | 11/2010 | Tang et al. | ..................... | 335/205 |
| 2006/0006674 A1 * | 1/2006 | Kang et al. | ................. | 292/251.5 |
| 2008/0174127 A1 * | 7/2008 | Kim et al. | .................... | 292/251.5 |
| 2010/0176698 A1 * | 7/2010 | Wu et al. | ..................... | 312/223.1 |

FOREIGN PATENT DOCUMENTS

GB   2264975 A   *   9/1993

* cited by examiner

Primary Examiner — Carlos Lugo
(74) Attorney, Agent, or Firm — Altis Law Group, Inc.

(57) ABSTRACT

A latching mechanism includes an engaging member made of magnetically conductive material and a magnetic assembly. The magnetic assembly includes a magnetic member and two fixing members made of magnetically conductive material. The magnetic member is capable of contacting the fixing member to magnetize the fixing member to attract the engaging member, and capable of being detached from the at least one fixing member with the magnetic field being shielded by the at least one fixing member to release the engaging member. The present disclosure further provides an electronic device using the latching mechanism.

11 Claims, 7 Drawing Sheets

LATCHING MECHANISM AND ELECTRONIC DEVICE USING THE SAME

BACKGROUND

1. Technical Field

The present disclosure generally relates to a latching assembly, and more particularly to an electronic device using the latching assembly.

2. Description of Related Art

Electronic devices, such as notebook computers are popular because of their convenience. An electronic device generally includes a main body and a cover hinged on the main body, capable of being latched with the main body to protect the screen when the electronic device is not used.

A latching mechanism applied in the electronic device generally includes a hook protruding from the cover and a groove defined in the main body. The cover is capable of being latched with the main body when the hook is received in the groove.

However, the hook protruding from the cover may affect appearance and be easily damaged. Furthermore, reception of the hook in the groove may loosen with time.

Therefore, there is room for improvement within the art.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout several views, and all the views are schematic.

DETAILED DESCRIPTION

The present latching mechanism may be applied in any electronic device with two or more hinged parts, such as notebook computers, LCD monitors, DVD (digital video disc) players, or other similar devices. Hereinafter, for the purposes of conveniently describing an exemplary application, the latching mechanism described and illustrated is applied in a notebook computer.

Figure 1:
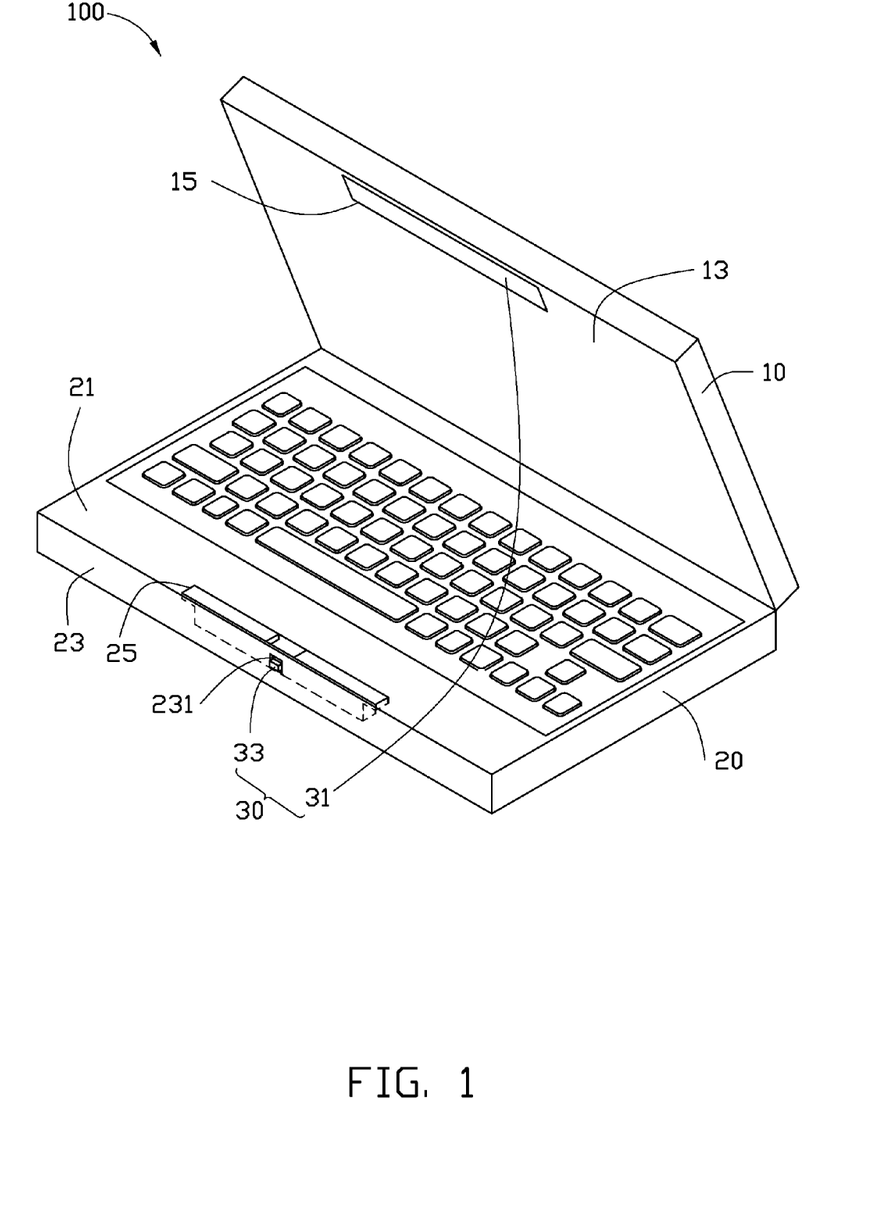
FIG. 1 is an assembled, isometric view of a first embodiment of an electronic device including a latching mechanism.

Referring to FIG. 1, an electronic device 100 of a first embodiment includes a cover 10, a main body 20 rotatably connected to an end of the cover 10, and a latching mechanism 30.

The cover 10 is substantially rectangular and includes a covering surface 13. The cover 10 further defines a groove 15 at an end away from the end connected to the main body 20.

The main body 20 is substantially rectangular and includes a covering surface 21 and a sidewall 23 adjacent to the covering surface 21. The main body 20 defines a T-shaped receiving groove 25 and a receiving hole 231 recessed from the sidewall 23 and communicating with the receiving groove 25. The covering surface 21 of the main body 20 faces the covering surface 13 of the cover 10.

Figure 2:
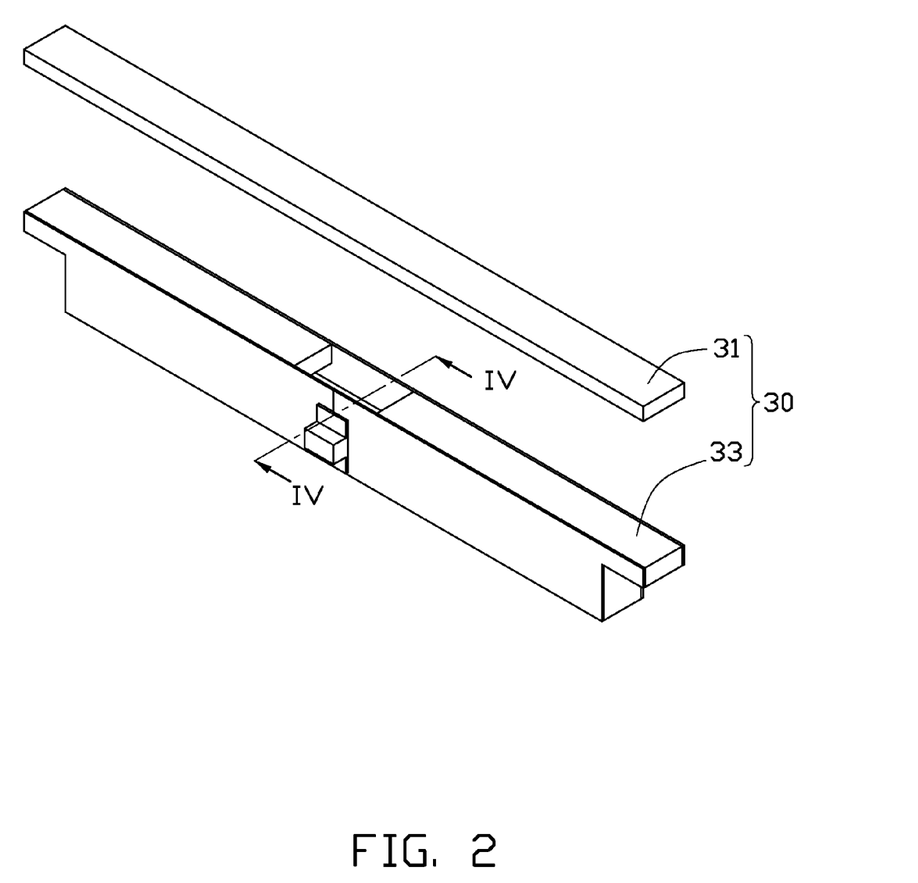
FIG. 2 is an isometric view of the latching mechanism of FIG. 1, the latching mechanism including an engaging member and a magnetic assembly.

Also referring to FIG. 2, the latching mechanism 30 includes an engaging member 31 positioned in the cover 10 and a magnetic assembly 33 positioned in the main body 20.

The engaging member 31 is substantially rectangular and is made of magnetic material or magnetically conductive material. The engaging member 31 is received in the groove 15 of the cover 10 and substantially coplanar with the covering surface 13 of the cover 10. In the illustrated embodiment, the engaging member 31 is made of iron.

Figure 3:
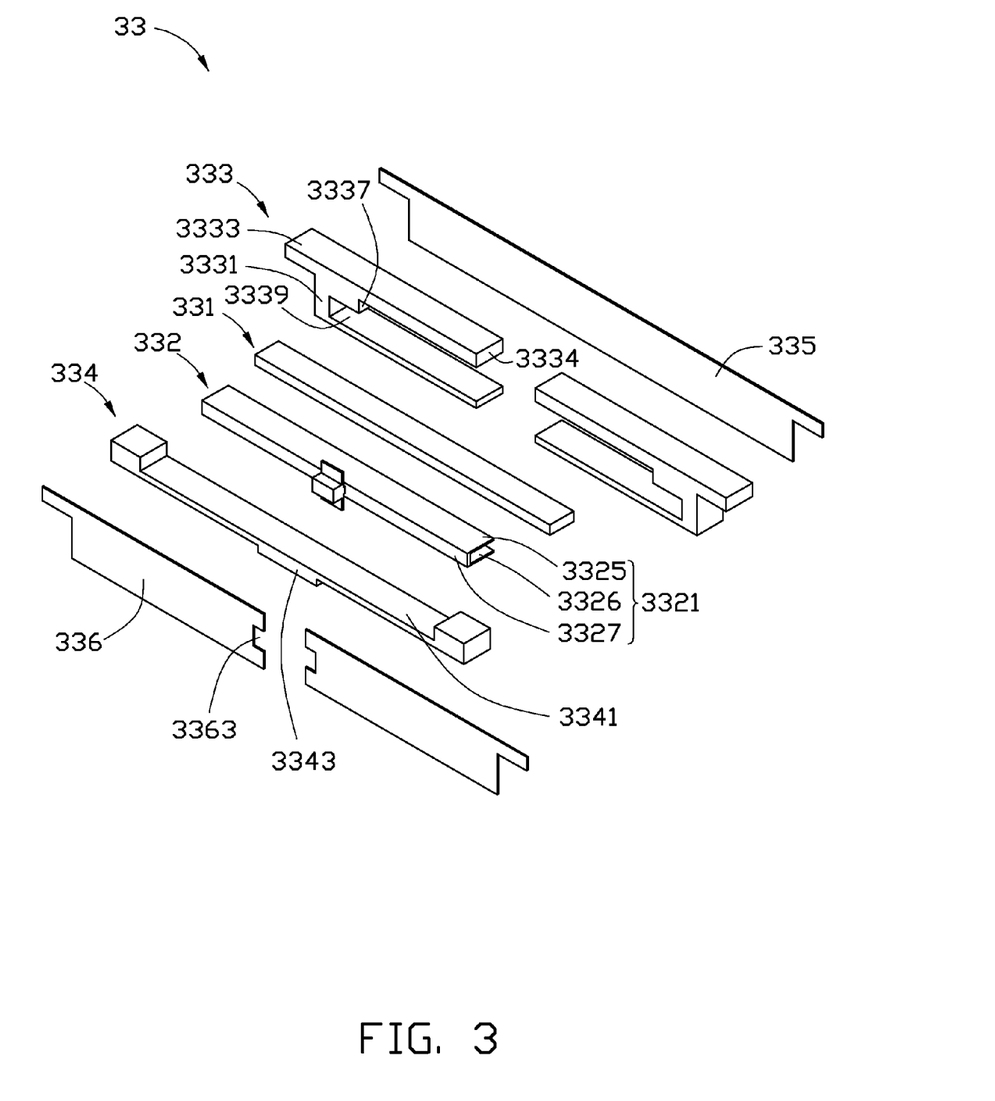
FIG. 3 is an exploded, isometric view of the magnetic assembly of FIG. 2.
Figure 4:
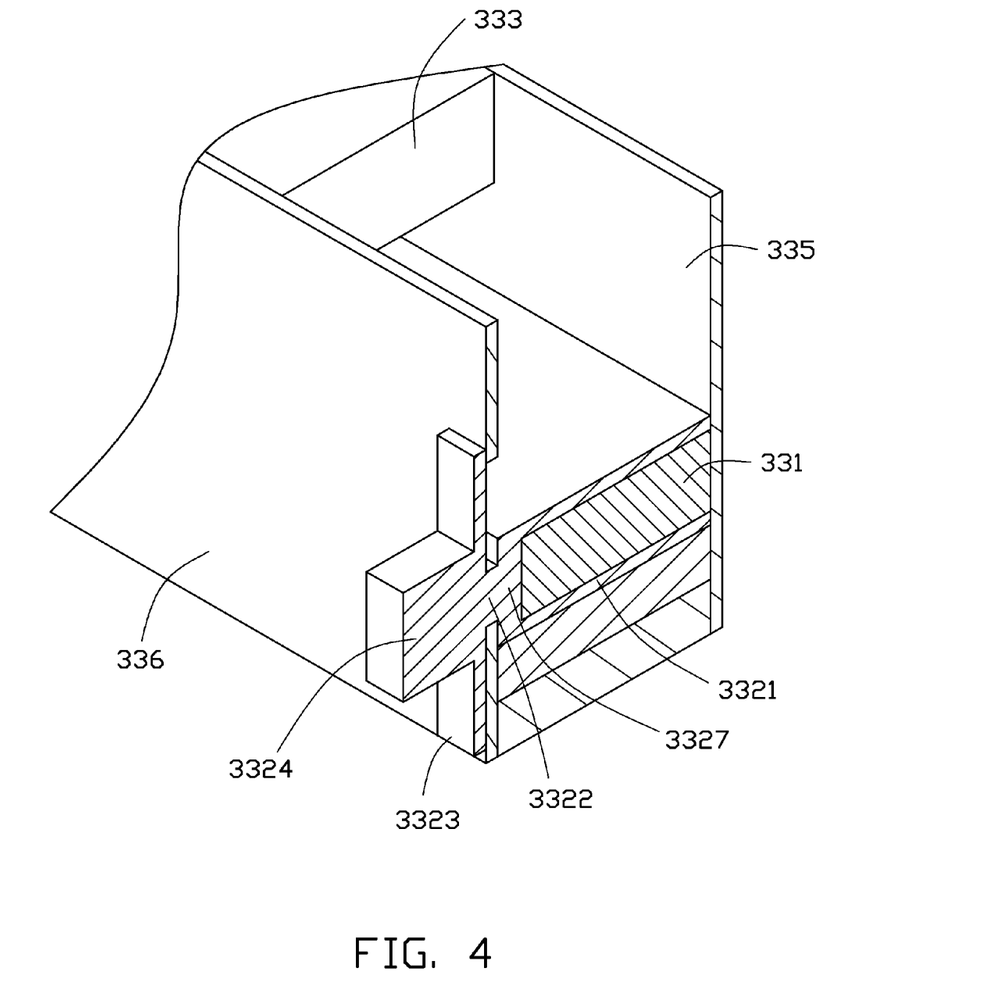
FIG. 4 is a cross-section of the magnetic assembly of FIG. 2, along line IV-IV.

Referring to FIGS. 3 and 4, the magnetic assembly 33 includes a magnetic member 331, a sliding member 332, two fixing members 333, an assisting member 334, a first location member 335, and two second location members 336.

The magnetic member 331 is substantially a rectangular bar. In the illustrated embodiment, the magnetic member 331 is a magnet.

The sliding member 332 includes a clamping portion 3321, a guide portion 3322, a restriction portion 3323, and an operating portion 3324.

The clamping portion 3321 is a bar with a U-shaped cross-section which includes a first clamping board 3325, a second clamping board 3326 substantially parallel to the first clamping board 3325, and a connection board 3327 connecting the first clamping board 3325 to the second clamping board 3326. A length of either the first clamping board 3325 or the second clamping board 3326 is less than that of the magnetic member 331. The distance between the first clamping board 3325 and the second clamping board 3326 is equal to a thickness of the magnetic member 331.

The guide portion 3322 extends substantially perpendicular to the connection board 3327 of the clamping portion 3321.

The restriction portion 3323 extends along an axis substantially perpendicular to the axis of the guide portion 3322. A length of the restriction portion 3323 exceeds the distance between the first clamping board 3325 and the second clamping board 3326.

The operating portion 3324 is a substantially rectangular portion extending away from the restriction portion 3323. The sliding member 332 is made of nonmagnetic material, such as plastic.

The fixing members 333 are made of magnetically conductive material. In the illustrated embodiment, the fixing members 333 are made of iron. Each fixing member 333 includes a fixing portion 3331 and a resisting portion 3333. The fixing portion 3331 is substantially rectangular and has an end surface 3334. The fixing portion 3331 defines a first receiving slot 3337 and a second receiving slot 3339 communicating with each other. The first receiving slot 3337 and the second receiving slot 3339 are through slots extending to opposite sides of each fixing member 333. A width of the second receiving slot 3339 exceeds that of the first receiving slot 3337. The resisting portion 3333 protrudes from an end of the fixing member 3331 away from the end surface 3334.

The assisting member 334 is made of nonmagnetic material, such as brass. The assisting member 334 is partially received in the second receiving slot 3339 of the fixing member 3331 and includes a slide slot 3341 and a support portion 3343. The slide slot 3341 is recessed from one side of the assisting member 334 and has a length corresponding to that of the magnetic member 331. The support portion 3343 is a protrusion formed on a side opposite to the side where the slide slot 3341 is defined.

The first location member 335 is substantially T-shaped. Each second location member 336 is substantially flat. An end of each second location member 336 defines a substantially rectangular notch 3363. The first location member 335 and the second location members 336 are made of magnetically non-conductive material. In the illustrated embodiment, the first location member 335 and the second location members 336 are made of copper.

During assembly, the assisting member 334 is received in the second receiving slot 3339 of the fixing members 333, and the support portion 3343 of the assisting member 334 resists the end surfaces 3334 of the fixing members 333. The slide slot 3341 of the assisting member 334 communicates with the first receiving slot 3337 of the fixing members 333. The magnetic member 51 is received in the clamping portion 3321 of the sliding member 332, and the first location member 335 is fixed on one side of the fixing members 333. Thereby, one side of the magnetic member 331 resists the connection board 3327 of the sliding member 332, and the other side of the magnetic member 331 resists the first location member 335. Because the length of either the first clamping board 3325 or the second clamping board 3326 is less than that of the magnetic member 331, two ends of the magnetic member 331 extend out of the sliding member 332. The second location members 336 are fixed on a side of the fixing member 333 opposite to the other side thereof where the first location member 335 is fixed. When the second location members 336 are fixed on the fixing member 333, the guide portion 3322 of the sliding member 332 is received in the notch 3363 of the second location members 336.

Referring to FIGS. 1 through 4, in the electronic device 100, the magnetic assembly 32 is received in the receiving slot 25 of the main body 20, and the operating portion 3324 of the sliding member 332 extends out of the sidewall 23 through the receiving hole 231. The restriction portion 3323 of the sliding member 332 is positioned between the second location members 336 and the sidewall 23 of the main body 20. The fixing member 333 remains consistent with the covering surface 21 of the main body 20.

Figure 5:
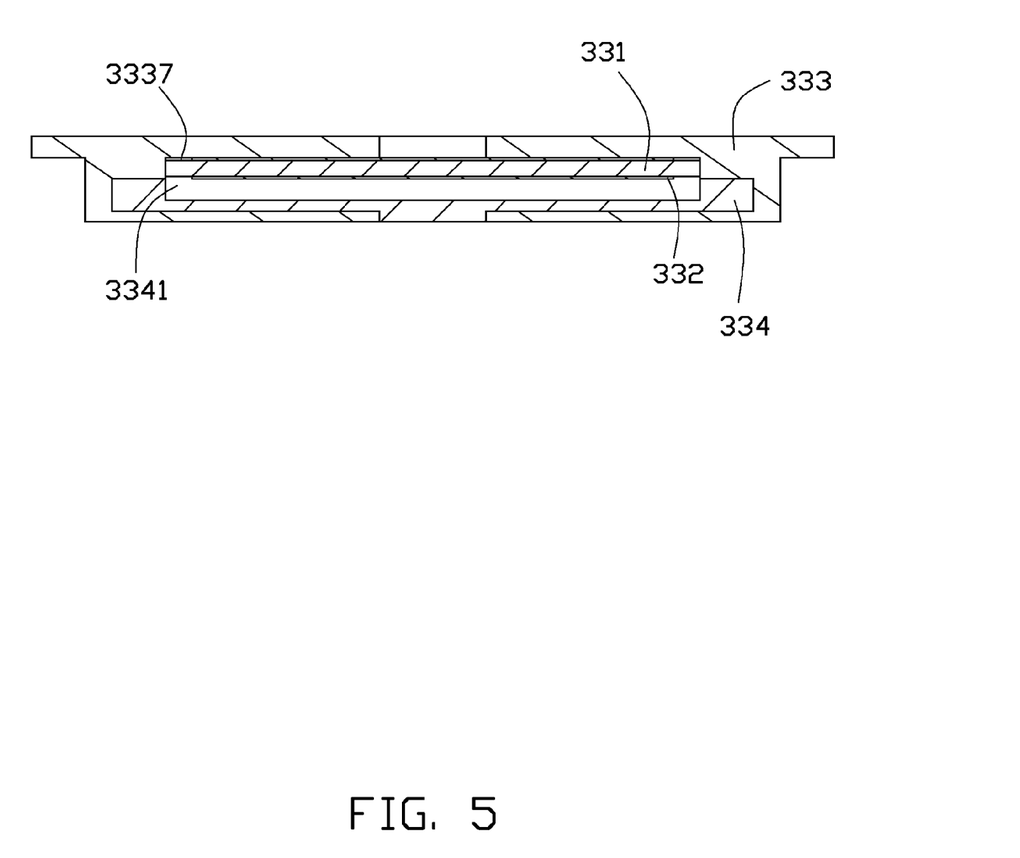
FIG. 5 is a cross-section of the latching mechanism of FIG. 2, showing one state of the engaging member and the magnetic assembly.

Also referring to FIG. 5, when the cover 10 is rotated to cover the main body 20, the covering surface 13 is rotated with the cover 10 to substantially contact the covering surface 21 of the main body 20. The operating portion 3324 of the sliding member 332 is pulled to draw the magnetic member 331 into the first receiving slot 3337 of the fixing members 333 with the sliding member 332, such that two ends of the magnetic member 331 resist the fixing members 333. Because the magnetic member 331 is a bar, the magnetic poles are on opposite ends. Furthermore, the fixing members 333 are made of iron and thus can be magnetized when contacting the magnetic member 331. Thereby, the engaging member 31 in the cover 10 is locked with the fixing members 333 in the main body 20, thus locking the cover 10 with the main body 20.

Figure 6:
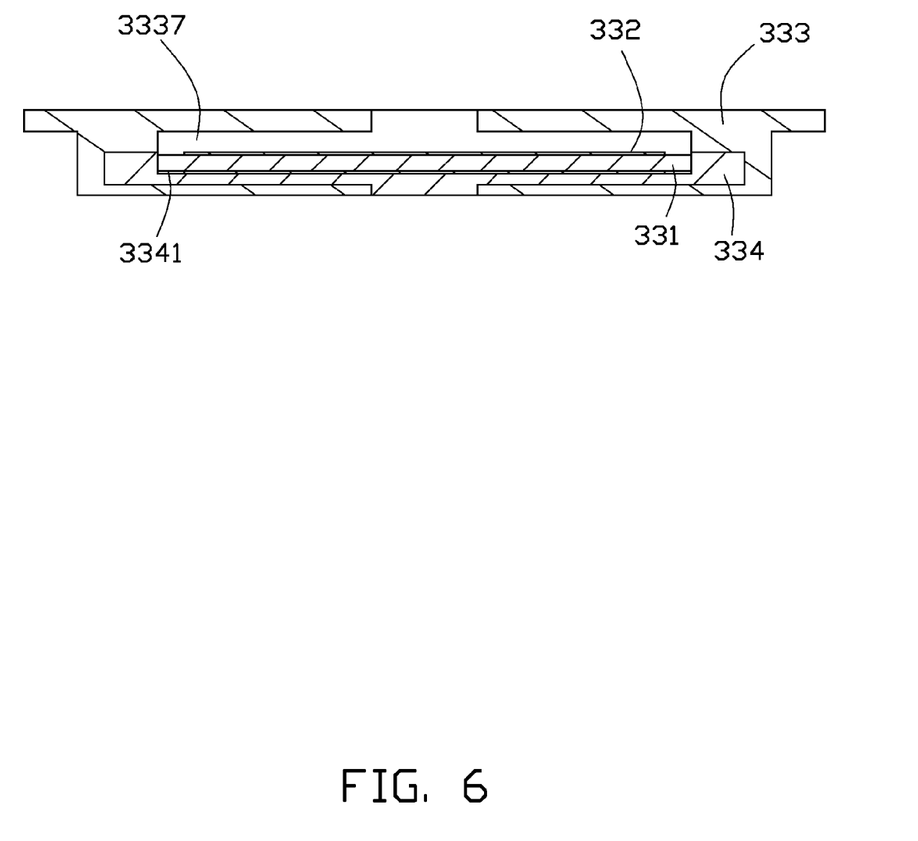
FIG. 6 is a cross-section of the latching mechanism of FIG. 2, showing another state of the engaging member and the magnetic assembly.

Also referring to FIG. 6, when the electronic device 100 is used, the operating portion 3324 of the sliding member 332 is pulled or pushed to draw the magnetic member 331 back into the slide slot 3341 of the assisting member 334 with the sliding member 332, such that two ends of the magnetic member 331 are separated from the fixing members 333 and resist the assisting member 334. Because the assisting member 334 is nonmagnetic, such as copper, and the magnetic member 331 is separated from the fixing members 333, the fixing members 333 are capable of shielding the magnetic field of the magnetic member 331. Therefore, the engaging member 31 may be released and the cover 10 can be rotated to open.

In the electronic device 100, the cover 10 and the main body 30 are locked or released by the engagement of the engaging member 31 and the magnetic assembly 33, so no hook is required. Therefore, the electronic device 100 may have a consistent, smooth surface. Furthermore, no gap can occur between the cover 10 and the main body 20 over time, because the cover 10 and the main body 20 may be closed stably and suffer no damage with impact. The cover 10 may be easily opened or locked relative to the main body 10 by switching the magnetism therebetween.

Alternatively, the first location member 335 and the second location members 336 may be omitted, and the magnetic assembly 50 received in the receiving slot 25 of the main body 20 contacting the sidewall 23 directly. The sliding member 332 may be omitted and, alternatively, an operating portion formed on the magnetic member 331. Each fixing member 333 may not define the second receiving slot 3339; therefore, the assisting member 334 is received in the first receiving slot 3337. The assisting member 334 may be omitted, in which case, the magnetic member 331 is positioned adjacent to one side of the slide fixing member 333 and away from the engaging member 31. The magnetic member 331 is capable of moving and contacting the fixing members 333, thus two ends of the magnetic member 331 may attract the engaging member 31. The magnetic member 331 is also capable of moving away and spaced from the fixing members 333 to release the engaging member 31. The engaging member 31 may also be positioned in the main body 20 and the magnetic assembly 33 may be positioned in the cover 10.

Figure 7:
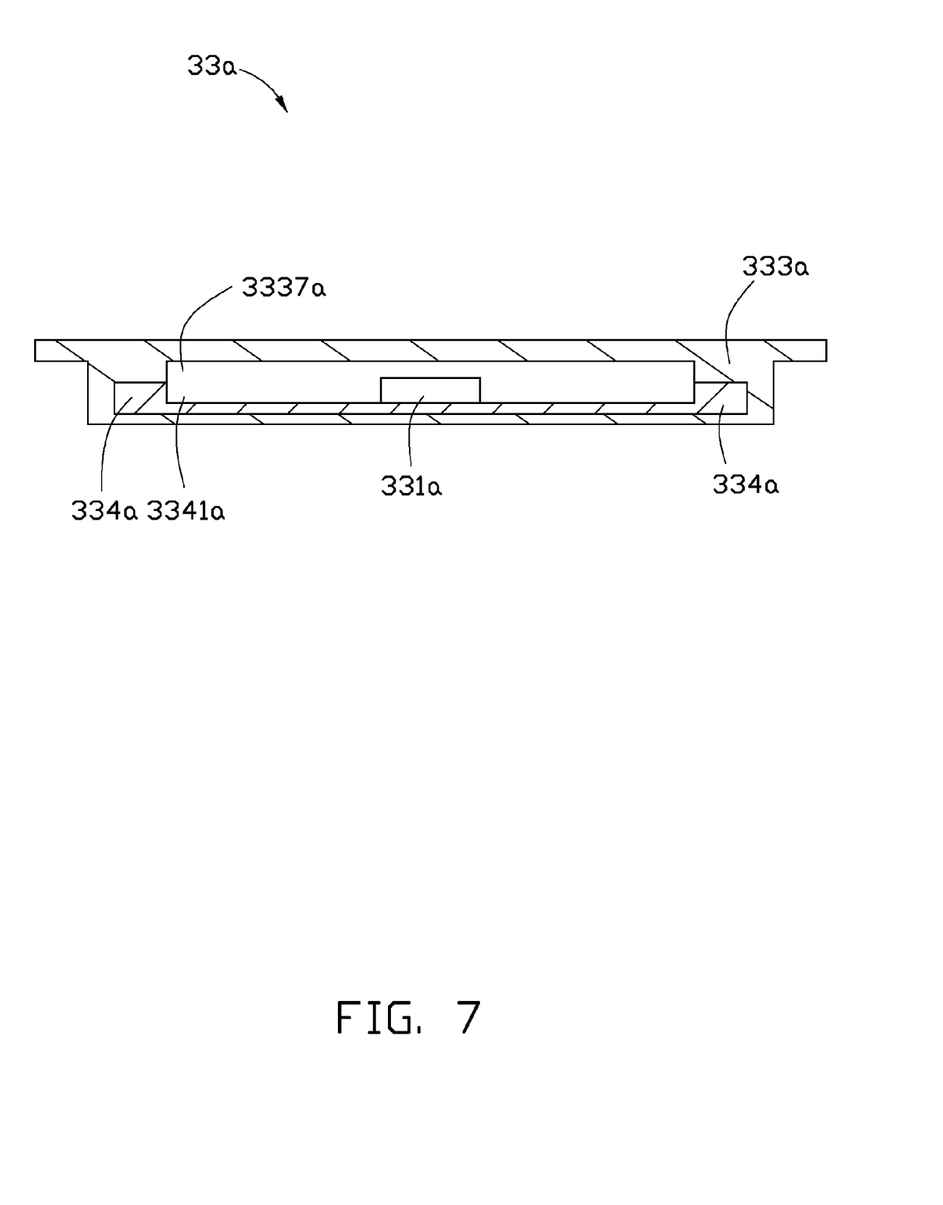
FIG. 7 is a cross-section of a second embodiment of a magnetic assembly.

Referring to FIGS. 1 and 7, an electronic device (not shown) of a second embodiment differs from the electronic device 100 of the first embodiment only in that a magnetic assembly 33a includes a fixing member 333a which is T-shaped. The fixing member 333a defines a first receiving slot 3337a in which an assisting member 334a is received. A magnetic member 331a is received in a slide slot 3341a with one end resisting the assisting member 334a and the other end facing the fixing member 333a. When two parts of the electronic device are locked with each other, one end of the magnetic member 331a resists the fixing member 333a, such that the fixing member 333a is magnetized. When the magnetic member 331a is away from the fixing member 333a, the fixing member 333a shields the magnetic field of the magnetic member 331a, such that the engaging member is released from the magnetic assembly 33a.

In the illustrated embodiment, the first receiving slot 3337a and the assisting member 334a may be omitted, and the fixing member 333a is a bar, in which case, the magnetic force may be changed by the switch between the contact of the magnetic member 331a and the fixing member 333a and between the separation of the magnetic member 331a and the fixing member 333a.

Finally, while various embodiments have been described and illustrated, the disclosure is not to be construed as being limited thereto. Various modifications can be made to the embodiments by those skilled in the art without departing from the true spirit and scope of the disclosure as defined by the appended claims.

What is claimed is:

1. A latching mechanism, comprising:
an engaging member made of magnetically conductive material, wherein the engaging member is capable of being positioned in a cover;

a magnetic assembly comprising a magnetic member and a fixing member made of magnetically conductive material, wherein the magnetic assembly is capable of being positioned in a main body rotatably connected to the cover;

wherein the magnetic assembly further comprises a sliding member having a clamping portion and an operation portion; the magnetic member is held by the clamping portion and drawn by the operation portion to contact the fixing member to magnetize the fixing member to attract the engaging member, or detach from the fixing member with the magnetic field shielded by the fixing member to release the engaging member.

2. The latching mechanism of claim 1, wherein the fixing member defines a first receiving slot and a second receiving slot communicating with the first receiving slot, and two ends of the magnetic member resist the fixing member by drawing the magnetic member into the first receiving slot.

3. The latching mechanism of claim 2, wherein the magnetic assembly further comprises an assisting member made of nonmagnetic material, the assisting member defines a slide slot communicating with the first receiving slot of the fixing member; the magnetic member is receivable in the slide slot to separate from the fixing member and receivable in the first receiving slot to contact the fixing member.

4. The latching mechanism of claim 3, wherein two ends of the assisting member are received in the second receiving slots of the fixing member respectively.

5. The latching mechanism of claim 1, wherein the magnetic member is a bar shaped magnet.

6. An electronic device, comprising:
a cover;
a main body; and
a latching mechanism comprising an engaging member made of magnetically conductive material and a magnetic assembly, the engaging member being fixed in one of the cover and the main body and the magnetic assembly being fixed in the other of the cover and the main body;

wherein the magnetic assembly comprises a magnetic member and a fixing member made of magnetically conductive material, the magnetic assembly further comprises a sliding member comprising a clamping portion and an operation portion, the magnetic member is held by the clamping portion and drawn by the operation portion to contact the fixing member to magnetize the fixing member to attract the engaging member, or detach from the fixing member with the magnetic force being shielded by the one fixing member to release the engaging member.

7. The electronic device of claim 6, wherein the fixing member defines a first receiving slot and a second receiving slot communicating with the first receiving slot, and two ends of the magnetic member resist the fixing member by drawing the magnetic member into the first receiving slot.

8. The electronic device of claim 7, wherein the magnetic assembly further comprises an assisting member made of nonmagnetic material; the assisting member defines a slide slot communicating with the first receiving slot of the fixing member; the magnetic member is received in the slide slot to separate from the fixing member; and the magnetic member is received in the first receiving slot to contact the fixing member.

9. The electronic device of claim 8, wherein two ends of the assisting member are received in the second receiving slots of the fixing member respectively.

10. The electronic device of claim 6, wherein the sliding member further comprises a manipulation portion extending from the clamping portion, one of the cover and the main body defines a receiving hole through which the manipulation portion extends.

11. The electronic device of claim 6, wherein the magnetic assembly further comprises an assisting member made of nonmagnetic material received in the fixing member, and the magnetic member is received in the fixing member with one side facing the assisting member.

* * * * *